(12) United States Patent
Baines et al.

(10) Patent No.: US 10,211,305 B2
(45) Date of Patent: Feb. 19, 2019

(54) NORMALLY-OFF HETROJUNCTION TRANSISTOR WITH HIGH THRESHOLD VOLTAGE

(71) Applicant: Commissariat à l'énergie atomique et aux énergies alternatives, Paris (FR)

(72) Inventors: Yannick Baines, Grenoble (FR); Julien Buckley, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/581,620

(22) Filed: Apr. 28, 2017

(65) Prior Publication Data
US 2017/0330944 A1 Nov. 16, 2017

(30) Foreign Application Priority Data
Apr. 29, 2016 (FR) ...................... 16 53905

(51) Int. Cl.
*H01L 29/423* (2006.01)
*H01L 29/66* (2006.01)
(Continued)

(52) U.S. Cl.
CPC ...... *H01L 29/4236* (2013.01); *H01L 29/0649* (2013.01); *H01L 29/0843* (2013.01);
(Continued)

(58) Field of Classification Search
CPC .... H01L 29/778; H01L 29/2003; H01L 29/66
See application file for complete search history.

(56) References Cited

U.S. PATENT DOCUMENTS

2010/0155720 A1* 6/2010 Kaneko ............... H01L 29/2003
257/43
2014/0077267 A1* 3/2014 Heo ..................... H01L 29/7787
257/194
(Continued)

OTHER PUBLICATIONS

French Preliminary Search Report dated Jan. 17, 2017 in French Application 16 53905 filed on Apr. 29, 2016 (with English Translation of Categories of Cited Documents and Written Opinion).
(Continued)

*Primary Examiner* — Changhyun Yi
(74) *Attorney, Agent, or Firm* — Oblon, McClelland, Maier & Neustadt, L.L.P.

(57) ABSTRACT

The invention relates to a normally-off high-electron-mobility field-effect transistor having a superposition of a first layer of semiconductor material and a second layer of semiconductor material so as form an electron gas layer at the interface between the first and second layers. A trench separates the superposition into first and second domains. An insulating element is positioned in the trench in order to electrically insulate the first and second domains. A p-doped semiconductor element is in contact with the first or the second layer of semiconductor material of the first and second domains, and extends continuously between the first and second domains. A gate insulator is positioned on the semiconductor element and a gate electrode is positioned on the gate insulator.

15 Claims, 4 Drawing Sheets

(51) Int. Cl.
   *H01L 29/205* (2006.01)
   *H01L 29/20* (2006.01)
   *H01L 29/08* (2006.01)
   *H01L 29/778* (2006.01)
   *H01L 29/06* (2006.01)
   *H01L 29/10* (2006.01)

(52) U.S. Cl.
   CPC ...... *H01L 29/1033* (2013.01); *H01L 29/2003* (2013.01); *H01L 29/205* (2013.01); *H01L 29/42356* (2013.01); *H01L 29/66462* (2013.01); *H01L 29/7786* (2013.01); *H01L 29/7787* (2013.01)

(56) References Cited

U.S. PATENT DOCUMENTS

| | | | |
|---|---|---|---|
| 2015/0034904 A1* | 2/2015 | Fujimoto | H01L 29/2003 257/20 |
| 2015/0054035 A1 | 2/2015 | Heo | |
| 2017/0077277 A1* | 3/2017 | Saito | H01L 29/7786 |
| 2017/0148906 A1* | 5/2017 | Iucolano | H01L 29/7787 |

OTHER PUBLICATIONS

Hiroshi Kambayashi et al. "Enhancement-mode GaN Hybrid MOS-HFETs on Si substrates with Over 70 A operation," 2009 21st International Symposium on Power Semiconductor Devices & IC'S (ISPSD), Jun. 2009, XP031485128, ISBN : 978-1-4244-3525-8, pp. 4.

\* cited by examiner

NORMALLY-OFF HETROJUNCTION TRANSISTOR WITH HIGH THRESHOLD VOLTAGE

The invention relates to heterojunction power transistors and, in particular, to normally-off heterojunction power transistors.

Higher performance is now required from many electronic applications, especially in embedded electronics intended for cars and ground-based means of transportation, in aeronautics and medical systems or in home automation solutions, for example. These applications for the most part require high-power switches functioning in frequency ranges often above one megahertz.

Historically, power switches have for a long time used field-effect transistors based on a semiconductor channel, most often made of silicon. At lower frequencies, junction transistors are preferred because they withstand higher current densities. However, because of the relatively limited breakdown voltage of each of these transistors, power applications require many transistors connected in series, or longer transistors, to be used, thereby resulting in a higher on-resistance. These transistors connected in series generate substantial losses, both in the steady-state and switching regimes.

An alternative for power switches, especially high-frequency power switches, is the use of heterojunction field-effect transistors, also referred to as heterostructure field-effect transistors. Such transistors notably include high-electron-mobility transistors, referred to as HEMTs.

In particular, a high-electron-mobility transistor includes the superposition of two semiconductor layers having different band gaps, forming a quantum well at their interface. Electrons are confined to this quantum well and form a two-dimensional electron gas. For reasons of high-voltage and temperature withstand, these transistors are chosen so as to have a wide energy band gap.

For certain applications, in particular safety applications with a view to isolating a circuit in the event of a control system malfunction, use is made of HEMT transistors that are normally off, i.e. their switching threshold voltage is positive, such that the transistor remains off in the absence of a control signal. There is a need for such transistors having a relatively high threshold voltage, typically of at least 3 V.

Because of the intrinsically conductive nature of the electron gas layer formed between a source and a drain, it is technologically easier to produce a normally-on heterojunction transistor. However, a number of fabrication processes have been developed with a view to forming normally-off heterojunction transistors.

Document US2014/077267 describes a normally-off high-electron-mobility field-effect transistor. An insulating trench extends into a layer of III-V semiconductor material.

Document U.S. Pat. No. 8,664,696 describes a normally-off HEMT transistor. The transistor includes the following stack of layers:
- a sapphire substrate;
- a nitride buffer layer, formed on the substrate;
- a GaN layer, which is not intentionally doped, formed on the buffer layer;
- a p-doped GaN layer, formed on the GaN layer which is not intentionally doped;
- an n-doped GaN layer, formed on the p-doped GaN layer;
- an n-doped AlGaN layer, formed on the n-doped GaN layer.

An electron gas layer is formed in proximity to the interface between the AlGaN layer and the n-doped GaN layer. A source and a drain are formed in contact with the AlGaN layer. A trench is formed through the AlGaN layer, through the n-doped GaN layer and extends up to the p-doped GaN layer. A gate insulator is interposed between the walls of the trench and a gate electrode formed inside the trench.

On either side of the trench, conduction towards the source and towards the drain takes place through the electron gas layer. The electron gas layer is interrupted by the gate trench.

When the bias voltage of the gate is lower than the threshold voltage of the transistor, no conduction channel connects the two parts of the electron gas layer on either side of the gate trench.

When the bias voltage of the gate is higher than the threshold voltage of the transistor, an inversion channel is formed in the p-type GaN layer below the gate trench. The electrons arising from the drain can then pass through this inversion channel in order to reach the source via the n-type GaN layer.

Such a transistor has a relatively high threshold voltage and the p-typed GaN layer limits the parasitic conduction of electrons at depth by acting as a back-barrier.

However, such a transistor has drawbacks. Specifically, the p-typed GaN layer is generally formed by epitaxy. The doping profile of this p-doped GaN layer is difficult to control, especially when the dopant is magnesium. Furthermore, for an n-doped GaN of low thickness, the electron gas is affected by the proximity of the p-doped GaN layer, resulting in the transistor having a high conduction resistance. A contrario, for an n-doped GaN layer of high thickness, the trench must be deeper. Such a trench depth results in transition resistances around the bottom of the trench, leading to the transistor having a high conduction resistance. Furthermore, a high conduction resistance is obtained through the p-doped GaN layer formed by epitaxy before the formation of the trench.

The invention aims to overcome one or more of these drawbacks. The invention thus pertains to a normally-off high-electron-mobility field-effect transistor, as defined in Claim 1. The invention also pertains to a fabrication process, as defined in Claim 15.

The invention also pertains to the variants defined in the dependent claims. A person skilled in the art will understand that each of the features of the variants of the dependent claims may be combined independently with the features of the independent claims, without however constituting an intermediate generalization.

Other features and advantages of the invention will become clearly apparent from the description that is given thereof below by way of completely non-limiting indication and with reference to the appended drawings, in which.

Figure 1:
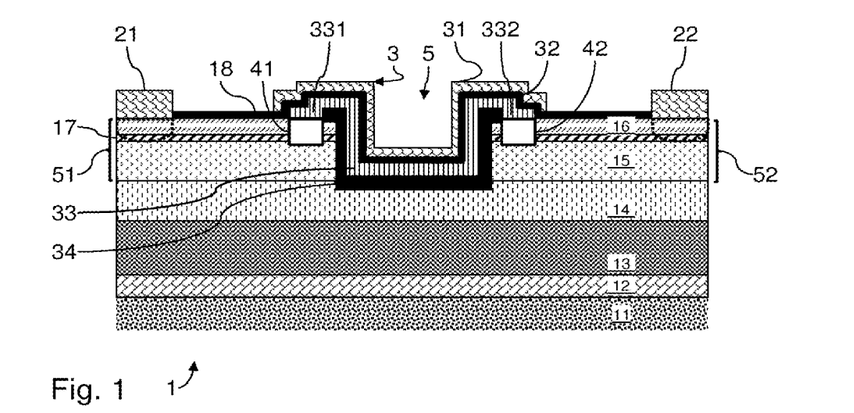
FIG. 1 is a view in cross section of a normally-off HEMT transistor according to one example of a first embodiment of the invention, in off configuration.
Figure 2:
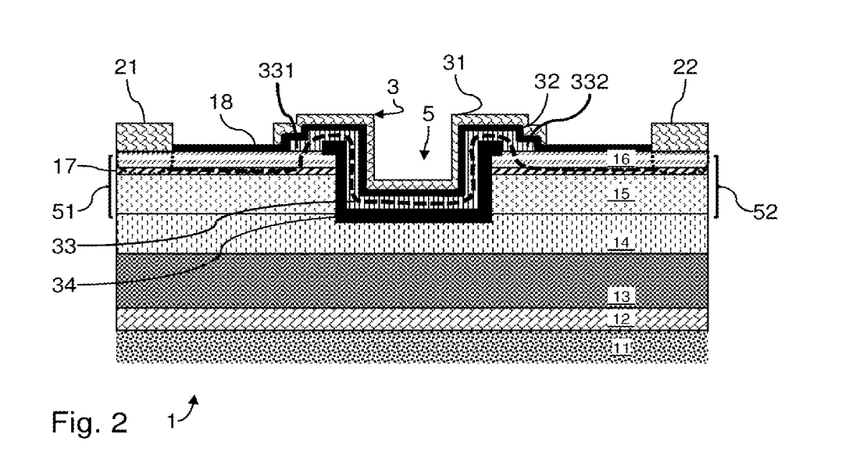
FIG. 2 is a view in cross section of the transistor of FIG. 1, in on configuration.

FIG. 1 is a view in cross section of a normally-off high-electron-mobility transistor 1 according to one example of a first embodiment of the invention. In FIG. 2, the transistor 1 is illustrated in the on state. The dashed line in FIG. 2 illustrates the conduction pathway.

The transistor 1 includes a substrate 11. The substrate 11 may for example be an electrical insulator or a p-doped or intrinsic silicon semiconductor material. The substrate 11 could for example be silicon with a (111) lattice orientation. The substrate 11 may also be made of silicon carbide or of sapphire. The thickness of the substrate 11 may be of the order of 650 μm, typically between 500 μm and 2 mm.

The transistor 1 advantageously includes here one (or more) matching layers (not illustrated) positioned on the substrate 11. The matching layer may be positioned in a manner known per se on the substrate 11, and serves as an intermediary between the substrate 11 and a buffer layer of semiconductor material 12 in order to allow lattice matching between the substrate 11 and the layer 12. The matching layer may typically be made of aluminium nitride.

The transistor 1 thus advantageously includes a layer of semiconductor material 12 forming a layer, referred to as a buffer layer, the role of which is to manage mechanical stresses and which contributes to the vertical electrical insulation of the structure. The layer 12 may be produced via the use of a single III-N semiconductor material, such as GaN that is not intentionally doped. It may also be produced via the stacking of various III-N semiconductor materials, such as an $Al_xGa_{1-x}N/GaN$ superlattice. The thickness of the semiconductor layer 12 may typically be between 100 nm and 5 μm. The semiconductor layer 12 may be formed in a manner known per se by epitaxy on the matching layer.

The transistor 1 includes a layer 13 made of a III-V alloy semiconductor material (for example a III-V binary alloy, for example made of an element III nitride, typically GaN) contributing to the vertical electrical insulation of the structure. The layer 13 may for example be of the type produced via the use of carbon-doped GaN. The layer 13 is here positioned on the buffer layer 12 and it may typically be from 100 nm to 5 μm thick and have a dopant concentration of between $1 \times 10^{18}$ cm$^{-3}$ and $1 \times 10^{19}$ cm$^{-3}$.

The transistor 1 includes a layer 14 made of a p-doped III-V alloy semiconductor material (for example a III-V binary alloy, for example made of an element III nitride, typically GaN). The layer 14 forms a back-barrier. The layer 14 allows the parasitic conduction of electrons at depth to be decreased. The layer 14 is here positioned on the layer 13. The layer 14 may typically be from 50 nm to 200 nm thick and have an Mg dopant concentration in the range of $1 \times 10^{17}$ cm$^{-3}$ to $1 \times 10^{18}$ cm$^{-3}$.

The transistor 1 includes a layer 15 made of a III-V alloy semiconductor material (for example a III-V binary alloy, for example made of an element III nitride, typically GaN). The layer 15 is here formed on the layer 14. The layer 15 is for example made of GaN. The layer is for example a layer referred to as a GaN channel. The layer 15 is for example of the not intentionally doped or heavily n-doped type. The thickness of the layer 15 may typically be between 50 and 500 nm.

The transistor 1 may include a thin $Al_xGa_{1-x}N$ layer between the layer referred to as the GaN channel 15 and the barrier layer 14. This layer may typically be made of AlN and be nearly 1 nm thick. The purpose of this layer, referred to as a spacer, is to enhance the confinement of the electron gas.

The transistor 1 additionally includes a layer 16 made of a III-V semiconductor alloy material (for example a III-V ternary alloy, for example made of an element III nitride, typically AlGaN or InAlN, or else an element III nitride quaternary alloy, for example $Al_xGa_yIn_{(1-x-y)}N$, while retaining a band gap that is larger than that of the material of the layer 15). The layer 16, typically called the barrier layer, is typically between 10 nm and 40 nm thick, for example 25 nm thick. The semiconductor layers 15 and 16 are superposed in a manner known per se in order to form an electron gas layer 17 at the interface or in proximity to the interface between these layers 15 and 16.

The transistor 1 additionally includes a drain 21. The drain 21 is here formed on the layer 16. The drain 21 is electrically connected to the electron gas layer 17. In the example illustrated, the drain 21 makes contact with the layer 16. The transistor 1 additionally includes a source 22. The source 22 is here formed on the layer 16. The source 22 is electrically connected to the electron gas layer 17. The drain 21 and the source 22 described are only provided by way of illustration and may have types of structures and connections other than those described in this example.

The transistor 1 additionally includes a control gate 3. The drain 21 and the source 22 are positioned on either side of the control gate 3. A trench 5 is formed below the control gate 3. The trench 5 passes through the layers 15 and 16 and thus interrupts the electron gas layer 17. The trench 5 thus separates the superposition of the layers 15 and 16 and the electron gas layer 17 into two disjunct domains 51 and 52. The trench 5 extends here up to within the p-doped layer 14.

The transistor 1 includes an insulating material element 34. The insulating material element 34 electrically insulates the domains 51 and 52 of the superposition of the layers 15 and 16. The element 34 interrupts in particular the electron gas layer 17 between the domains 51 and 52. The element 34 covers here the lateral walls of the trench 5 and therefore makes contact with the lateral faces of the layers 15 and 16. The element 34 covers here the bottom wall of the trench 5 and therefore makes contact with the layer 14 at the bottom of the trench 5. The element 34 also includes edges that cover part of the layer 16 in the domains 51 and 52, respectively.

The transistor 1 additionally comprises a p-doped semiconductor element 33. The semiconductor element 33 makes contact with one layer of the stack of layers 15 and 16 in the domain 51 on the one hand and in the domain 52 on the other hand. In this example, the semiconductor element 33 makes contact with the layer 16 in the domain 51 on the one hand and in the domain 52 on the other hand. The semiconductor element 33 thus includes a portion 331 in contact with the layer 16 in the domain 51 and a portion 332 in contact with the layer 16 in the domain 52. Furthermore, the semiconductor element 33 extends continuously between the portions 331 and 332, i.e. between the domains 51 and 52. The semiconductor element 33 is here formed so as to cover the insulating element 34. The semiconductor element 33 protrudes laterally beyond the insulating element 34, in order to form the portions 331 and 332 in contact with the layer 16. The semiconductor element 33 includes a part housed in the trench 5, which covers the lateral walls and the bottom wall of the insulating element 34.

The transistor 1 additionally comprises a gate insulator 32 formed on the semiconductor element 33. The transistor 1 additionally includes a gate electrode 31 formed on the gate insulator 32. The gate electrode 31 is formed at the vertical of the semiconductor element 33. In particular, the projection of the gate electrode 31 towards the substrate 11 in a direction normal to this substrate 11 includes the projection of the semiconductor element 33 towards this substrate 11 in the direction normal to this substrate 11. Thus, the semiconductor element 33 is indeed positioned within the electromagnetic field of the gate electrode 31 when the latter is biased. The control electrode 31 may be made in a manner known per se of metal (for example of TiN) or of doped polysilicon. The gate electrode 31 is electrically insulated from the drain 21 and from the source 22 by an insulating layer 18, the insulating layer 18 being here formed on the layer 16 in continuity of the gate insulator 32. A control potential is applied selectively to the gate electrode 31 via a control circuit (not illustrated).

In FIG. 1, the transistor 1 is illustrated in its off or open configuration. The insulating element 34 and the semiconductor element 33 render the transistor 1 normally off, conduction between the domains 51 and 52 being interrupted when a potential applied to the gate electrode 31 is lower than the threshold voltage. The insulating element 34 de facto forms electrical insulation between the domains 51 and 52 of the superposition of the layers 15 and 16. The semiconductor element 33 de facto provides electrical insulation between its portions 331 and 332 when the potential on the gate electrode 31 is lower than the threshold voltage. The transistor 1 is therefore indeed a normally-off transistor.

The distance between the portions 331 and 332 is typically shorter than 1 μm with a view to limiting the conduction pathway in the inversion layer. Furthermore, it may be noted that the portions 331 and 332 of the semiconductor element 33 cause local depletion in the layers 16 and 15 due to the "pin" nature of the junctions formed by the stack of the layers 33/16/15 at these locations. A depletion 41 is thus formed below the portion 331, and a depletion 42 is thus formed below the portion 332. Below the trench 5, the p-doped layer 14 forms a back-barrier for the purpose of blocking conduction between the domains 51 and 52, in the absence of bias on the gate electrode 31. The layer 14 thus contributes to limiting the lateral leakage current of the transistor 1 in the off state. It should be noted that the lateral leakage current will be greatly limited by:
  the absence of an electron channel in the p-type layer 33 with gate bias below the threshold;
  the use of field plates in the gate-to-drain spacing, well known to those skilled in the art. The purpose of these field plates (not illustrated) is to guide the lateral depletion of the two-dimensional electron gas in the gate-to-drain spacing in the off state as the drain voltage increases. The space-charge zone thus created in the gate-to-drain spacing strongly contributes to limiting the lateral leakage currents.

In FIG. 2, the transistor 1 is illustrated in its on configuration. By applying a potential that is higher than the threshold voltage to the gate electrode 31, an inversion channel is formed in the semiconductor element 33. The semiconductor element 33 then allows electrons to pass from zones 51 to 52. An electronic conduction pathway is thus created between the portion 331 and the portion 332 through the semiconductor element 33. The electron gas layers of the domains 51 and 52 thus find themselves connected by an n-type conduction pathway. Conduction thus takes place between the drain 21 and the source 22 (as illustrated by the dashed line). It may also be noted that the field applied to the gate electrode 31 removes the depletion zones 41 and 42 below the portions 331 and 332.

In the embodiment illustrated, a potential on the gate electrode 31 that is higher than the threshold voltage may also allow a conductive link to be formed in the layer 14 below the trench 5. Such a junction that is conductive when the transistor 1 is in the on state thus allows its resistance in the on state to be decreased. Such a junction that is conductive in the on state may for example be obtained using an insulating element 34, a semiconductor element 33 and a gate insulator 32 that are sufficiently thin.

When the layers 15 and 16 are formed by epitaxy, the semiconductor element 33 may advantageously be formed without the use of an epitaxy machine, although pGaN epitaxial regrowth is possible (while expensive and complex). In particular, a semiconductor element 33 may easily be formed on the insulating element 34 without the use of an epitaxy machine, for example on the basis of reactive sputtering (for NiO for example) or on the basis of vapour phase deposition (for polysilicon for example).

The layer 15, which is intrinsic in its bulk and n-type close to the interface with the layer 16 (location of the electron channel) forms an NiP junction with the layer 14. Thus, from the domain 51 to the domain 52, two NiP junctions are linked head-to-tail below the insulating element 34, which configuration is naturally blocking in the absence of bias on the gate electrode 31.

The depth of the trench 5 is advantageously at least 100 nm (measured between the upper face of the layer 16 and the bottom of the trench 5). The width of the trench 5 is advantageously at most 1 μm.

The insulating element 34 is for example made of $Al_2O_3$, $SiO_2$ or of SiN. The thickness of the insulating element 34 is typically between 10 nm and 200 nm.

The choice of p-type semiconductor element 33 aims to address the following selection criteria:
1. A large band gap and capacity to be doped at high concentrations ($1 \times 10^{18}$ cm$^{-3}$): this favours the obtention of a high threshold voltage (according to MOSFET theory)
2. Conduction properties of the element 33, low resistivity is sought: thus, the element 33 does not introduce any substantial series resistance, which avoids having an impact on the on-state current of the transistor.
3. Semiconductor 33/GaN channel potential barrier. The electron affinity of the GaN and of the semiconductor element 33 should be similar (or have conduction bands that are almost aligned): this avoids the formation of a potential barrier preventing passage between the GaN and the element 33, which would decrease the on-state current of the transistor.

Satisfying these various criteria is difficult.

p-NiO is preferred for criterion 1, or even for 2.

p-polysilicon is preferred according to criteria 2 and 3. This material partly meets criterion 1 (small band gap but heavy doping). P-polysilicon will generally be the preferred choice.

p-GaN is preferred according to criteria 1 and 3.

The semiconductor element 33 is for example formed on the basis of NiO deposition, which material is naturally p-doped. NiO will for example be preferred for a transistor 1 that has to have a high threshold voltage owing to its large band gap (3.4 eV) and its capacity to be heavily p-doped ($>1 \times 10^{18}$ cm$^{-3}$). The semiconductor element 33 may also be formed on the basis of p-doped polysilicon deposition. Polysilicon deposition will for example be preferred for favouring high electron mobility in the semiconductor element 33 in the on state. Polysilicon may indeed be doped at high p-doping concentrations. The p-type dopant concentration in the element 33 made of polysilicon is advantageously between $2*10^{17}$ cm$^{-3}$ and $1*10^{18}$ cm$^{-3}$, and advantageously between $3*10^{17}$ cm$^{-3}$ and $8*10^{17}$ cm$^{-3}$. Polysilicon also exhibits better compatibility at the interface of the portions 331 and 332 with a layer 16 of AlGaN. The band gap of polysilicon is typically of the order of 1.1 eV. Other p-doped semiconductor materials could also be envisaged, for example p-type diamond. The thickness of the semiconductor element 33 is typically between 50 and 150 nanometers.

The thickness of the gate insulator 32 is typically between 20 and 60 nanometers, for example 30 nm. The gate insulator 32 may be formed from a material such as $SiO_2$ or $Al_2O_3$.

In the first embodiment illustrated, it is also desirable to be able to produce a junction below the trench 5 that is conductive when the transistor 1 is in the on state. To achieve this, a thin insulating element 34, the thickness of which is 30 nm for example, and a relatively thin semiconductor element 33, the thickness of which is typically less than 100 nm for example, are advantageously used. The thickness of the gate insulator 32 will also preferably be around 30 nm. The depth of the trench 5 will advantageously be less than 100 nm, preferably less than 80 nm.

Figure 3:
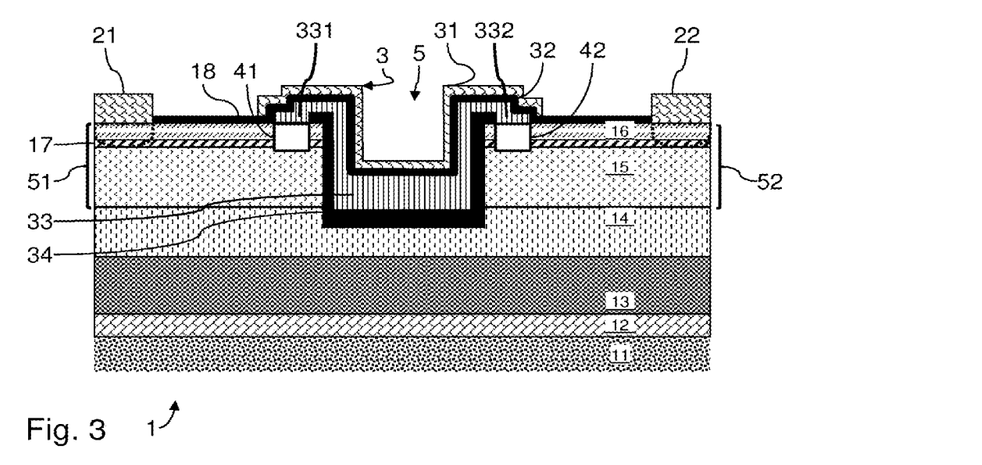
FIG. 3 is a view in cross section of a normally-off HEMT transistor according to one example of a second embodiment of the invention, in off configuration.
Figure 4:
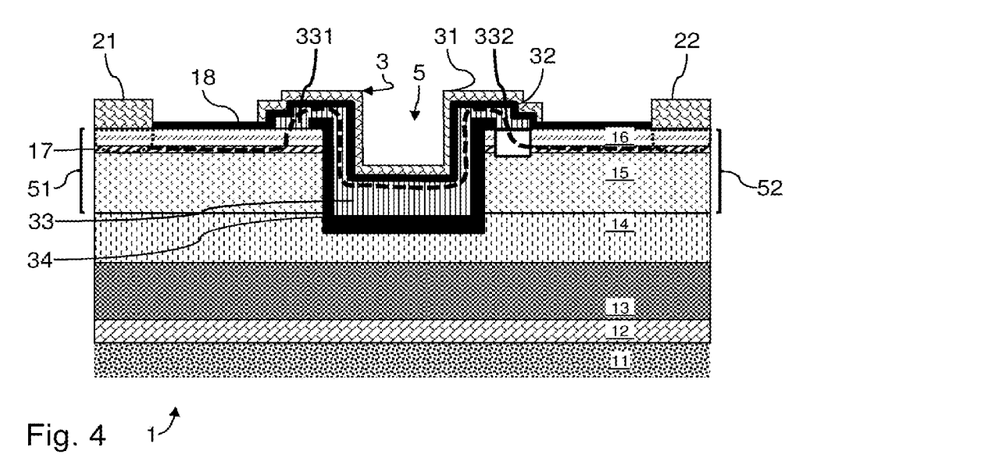
FIG. 4 is a view in cross section of the transistor of FIG. 3, in on configuration.

FIG. 3 is a view in cross section of a normally-off high-electron-mobility transistor 1 according to one example of a second embodiment of the invention. In FIG. 4, the transistor 1 is illustrated in the on state. The dashed line in FIG. 4 illustrates the conduction pathway.

In the second embodiment, it is desirable to be able to prevent the formation of a conductive junction below a trench 5, even when the transistor 1 is in the on state. In this second embodiment, the transistor 1 includes the following elements, which are identical to those of the first embodiment:
the substrate 11;
the matching layer;
the layer of semiconductor material 12;
the layer of semiconductor material 13.

The transistor 1 advantageously includes a layer 14 made of a p-doped III-V alloy semiconductor material (for example identical to that of the first embodiment). The layer 14 forms a back-barrier. The layer 14 allows the parasitic conduction of electrons at depth to be decreased. The layer 14 is here positioned on the layer 13.

The transistor 1 includes a layer 15 made of a III-V alloy semiconductor material (for example identical to that of the first embodiment), formed on the layer 14. The thickness of the layer 15 may be as described for the first embodiment, or it may be higher.

The transistor 1 additionally includes a layer 16 made of a III-V alloy semiconductor material (for example identical to that of the first embodiment). The thickness of the layer 16 may be as described for the first embodiment. The semiconductor layers 15 and 16 are superposed in a manner known per se in order to form an electron gas layer 17 at the interface or in proximity to the interface between these layers 15 and 16.

The transistor 1 additionally includes a drain 21 formed in contact with the layer 16 and electrically connected to the electron gas layer 17. The transistor 1 additionally includes a source 22 formed in contact with the layer 16 and electrically connected to the electron gas layer 17.

The transistor 1 additionally includes a control gate 3, the drain 21 and the source 22 being positioned on either side of the control gate 3. A trench 5 is formed below the control gate 3 and passes through the layers 15 and 16, thus interrupting the electron gas layer 17. The trench 5 thus separates the superposition of the layers 15 and 16 and the electron gas layer 17 into two disjunct domains 51 and 52. The trench 5 extends here up to within the p-doped layer 14. The trench 5 may even extend beyond the layer 14.

The transistor 1 includes an insulating material element 34, electrically insulating the domains 51 and 52 of the superposition of the layers 15 and 16. The element 34 interrupts in particular the electron gas layer 17 between the domains 51 and 52, covers the lateral walls of the trench 5 and therefore makes contact with the lateral faces of the layers 15 and 16. The element 34 covers here the bottom wall of the trench 5 and therefore makes contact with the layer 14 at the bottom of the trench 5. The element 34 also includes edges that cover part of the layer 16 in the domains 51 and 52, respectively.

The transistor 1 additionally comprises a p-doped semiconductor element 33 that makes contact with the layer 16 in the domain 51 on the one hand and in the domain 52 on the other hand. The semiconductor element 33 thus includes a portion 331 in contact with the layer 16 in the domain 51 and a portion 332 in contact with the layer 16 in the domain 52. Furthermore, the semiconductor element 33 extends continuously between the portions 331 and 332, i.e. between the domains 51 and 52. The semiconductor element 33 is here formed so as to cover the insulating element 34. The semiconductor element 33 protrudes laterally beyond the insulating element 34, in order to form the portions 331 and 332 in contact with the layer 16. The semiconductor element 33 includes a part housed in the trench 5, which covers the lateral walls and the bottom wall of the insulating element 34.

The transistor 1 additionally comprises a gate insulator 32 formed on the semiconductor element 33. The transistor 1 additionally includes a gate electrode 31 formed on the gate insulator 32. The gate electrode 31 is formed in line with the semiconductor element 33. In particular, the projection of the gate electrode 31 towards the substrate 11 in a direction normal to this substrate 11 includes the projection of the semiconductor element 33 towards this substrate 11 in the direction normal to this substrate 11. Thus, the semiconductor element 33 is indeed positioned within the electromagnetic field of the gate electrode 31 when the latter is biased. The control electrode 31 may be produced in the same material as for the first embodiment. The gate electrode 31 is electrically insulated from the drain 21 and from the source 22 by a insulating layer 18, formed on the layer 16 in continuity of the gate insulator 32. A control potential is applied selectively to the gate electrode 31 via a control circuit (not illustrated).

In FIG. 3, the transistor 1 is illustrated in its off configuration. The insulating element 34 and the semiconductor element 33 render the transistor 1 normally off, conduction between the domains 51 and 52 being interrupted when a potential applied to the gate electrode 31 is lower than the threshold voltage. Furthermore, it may be noted that the portions 331 and 332 of the semiconductor element 33 may induce a field in the layer 16, leading to local depletion and to additional electrical insulation, here at the interface between the portions 331, 332 and the layer 16. A depletion 41 is thus formed below the portion 331, and a depletion 42 is thus formed below the portion 332.

In FIG. 4, the transistor 1 is illustrated in its on configuration. By applying a potential that is higher than the threshold voltage to the gate electrode 31, an inversion channel is formed in the semiconductor element 33. The semiconductor element 33 then becomes conductive. A conduction pathway is thus created between the portion 331 and the portion 332 through the semiconductor element 33. An electrical connection is thus formed between the electron gas layer 17 of the domains 51 and 52. Conduction thus takes place between the drain 21 and the source 22 (as illustrated by the dashed line).

With respect to the first embodiment, the transistor 1 includes here:

a deeper trench 5, for example for a thicker layer 15. Such a thicker layer 15 allows the distance between the electron gas layer 17 and the bottom of the trench 5 to be increased, such that resistance is increased in the event of conduction having to be formed below the trench 5. It is also possible to envisage a layer 15 of the same thickness and a thicker layer 14;

the thickness of the insulating element 34 and/or of the semiconductor element 33 is increased, such that, in the layer 14 below the trench 5, the electromagnetic field applied by the gate electrode 31 biased to the threshold voltage is not sufficient to form an inversion channel. The application of a threshold voltage to the gate electrode 31 does not then allow conduction to be obtained below the trench 5 via the layer 14.

The depth of the trench 5 may be greater than 200 nm and extend beyond the layers 14 and 15 in depth.

The thickness of the element 34 is 100 nm for example.

Figure 5:
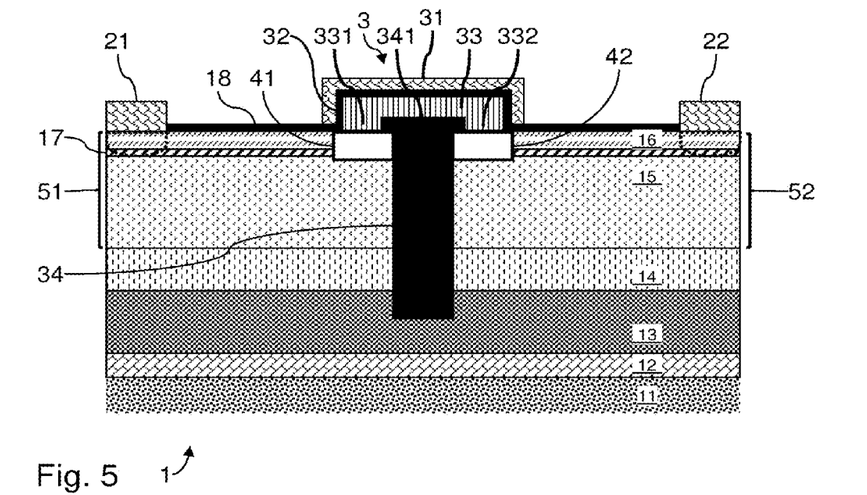
FIG. 5 is a view in cross section of a normally-off HEMT transistor according to one example of a third embodiment of the invention, in off configuration.
Figure 6:
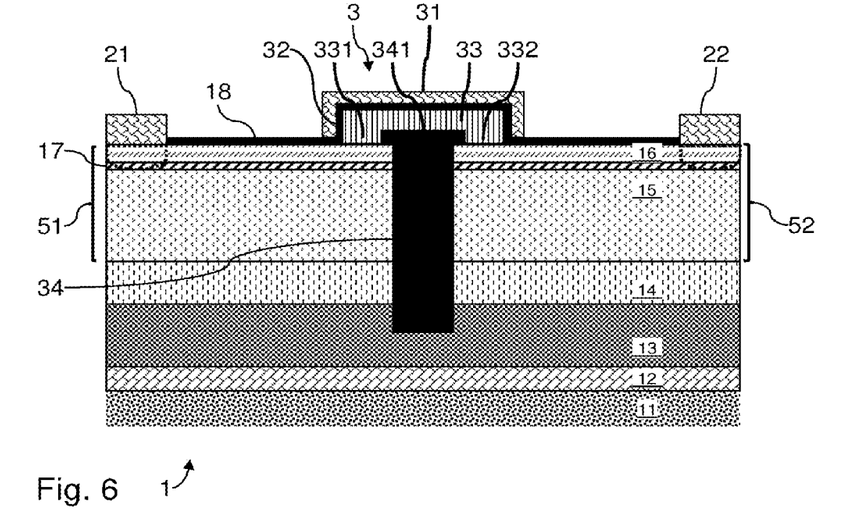
FIG. 6 is a view in cross section of the transistor of FIG. 5, in on configuration.

FIG. 5 is a view in cross section of a normally-off high-electron-mobility transistor 1 according to one example of a third embodiment of the invention. In FIG. 6, the transistor 1 is illustrated in the on state.

In the third embodiment, it is desirable to be able to prevent the formation of a conductive junction below one trench, even when the transistor 1 is in the on state. In this third embodiment, the transistor 1 includes the following elements, which are identical to those of the first embodiment:

the substrate 11;
the matching layer;
the layer of semiconductor material 12.

The transistor 1 advantageously includes a layer 13 made of a III-V alloy semiconductor material (for example a III-V binary alloy, for example made of an element III nitride, typically GaN). The layer 13 may for example be of the not intentionally doped or n-doped type. The layer 13 is here positioned on the buffer layer 12.

The transistor 1 advantageously includes a layer 14 made of a p-doped III-V alloy semiconductor material (for example identical to that of the first embodiment). The layer 14 forms a back-barrier. The layer 14 allows the parasitic conduction of electrons at depth to be decreased. The layer 14 is here positioned on the layer 13.

The transistor 1 includes a layer 15 made of a III-V alloy semiconductor material (for example identical to that of the first embodiment), formed on the layer 14. The thickness of the layer 15 is advantageously at least equal to 50 nm.

The transistor 1 additionally includes a layer 16 made of a III-V alloy semiconductor material (for example identical to that of the first embodiment). The thickness of the layer 16 may be as described for the first embodiment. The semiconductor layers 15 and 16 are superposed in a manner known per se in order to form an electron gas layer 17 at the interface or in proximity to the interface between these layers 15 and 16.

The transistor 1 additionally includes a drain 21 formed in contact with the layer 16 and electrically connected to the electron gas layer 17. The transistor 1 additionally includes a source 22 formed in contact with the layer 16 and electrically connected to the electron gas layer 17.

The transistor 1 additionally includes a control gate 3, the drain 21 and the source 22 being positioned on either side of the control gate 3. A trench is formed below the control gate 3 and passes through the layers 15 and 16, thus interrupting the electron gas layer 17. The trench thus separates the superposition of the layers 15 and 16 and the electron gas layer 17 into two disjunct domains 51 and 52. The trench also passes through the p-doped layer 14. The trench extends as far as the layer 13. The depth of the trench is advantageously at least 200 nm.

The transistor 1 includes an insulating material element 34, electrically insulating the domains 51 and 52 of the superposition of the layers 15 and 16. The element 34 interrupts in particular the electron gas layer 17 between the domains 51 and 52. The element 34 fills the trench in order to cover its lateral walls (and therefore makes contact with the lateral faces of the layers 15 and 16) and covers its bottom wall. The element 34 therefore makes contact with the layer 13. The element 34 includes a protrusion 341, which extends vertically beyond the trench. The protrusion 341 thus extends vertically beyond the upper face of the layer 16. The element 34 also includes edges that cover part of the layer 16 in the domains 51 and 52, respectively. The insulating element 34 may be formed from an insulating material such as $SiO_2$ or $Al_2O_3$. The insulating element 34 may also be formed from a semiconductor material that has undergone implantation of argon directly into the III-N layers, providing insulation without requiring later etching, semiconductor deposition and implantation operations.

The transistor 1 additionally comprises a p-doped semiconductor element 33 that makes contact with the layer 16 in the domain 51 on the one hand and in the domain 52 on the other hand. The semiconductor element 33 thus includes a portion 331 in contact with the layer 16 in the domain 51 and a portion 332 in contact with the layer 16 in the domain 52. Furthermore, the semiconductor element 33 extends continuously between the portions 331 and 332, i.e. between the domains 51 and 52. The semiconductor element 33 is here formed so as to cover the insulating element 34 and in particular the protrusion 341. The semiconductor element 33 is positioned fully above the layer 16 and includes no part housed in the trench. The semiconductor element 33 protrudes laterally beyond the insulating element 34, in order to form the portions 331 and 332 in contact with the layer 16.

The transistor 1 additionally comprises a gate insulator 32 formed on the semiconductor element 33. The transistor 1 additionally includes a gate electrode 31 formed on the gate insulator 32. The gate electrode 31 is formed at the vertical of the semiconductor element 33. In particular, the projection of the gate electrode 31 towards the substrate 11 in a direction normal to this substrate 11 includes the projection of the semiconductor element 33 towards this substrate 11 in the direction normal to this substrate 11. Thus, the semiconductor element 33 is indeed positioned within the electromagnetic field generated by the gate electrode 31 when the latter is biased. The control electrode 31 may be produced in the same material as for the first embodiment. The gate electrode 31 is electrically insulated from the drain 21 and from the source 22 by a insulating layer 18, formed on the layer 16 in continuity of the gate insulator 32. A control potential is applied selectively to the gate electrode 31 via a control circuit (not illustrated).

In FIG. 5, the transistor 1 is illustrated in its off configuration. The insulating element 34 and the semiconductor element 33 render the transistor 1 normally off, conduction between the domains 51 and 52 being interrupted when a potential applied to the gate electrode 31 is lower than the threshold voltage. Furthermore, it may be noted that the portions 331 and 332 of the semiconductor element 33 may induce a field in the layer 16, leading to local depletion and to additional electrical insulation, here at the interface between the portions 331, 332 and the layer 16. A depletion 41 is thus formed below the portion 331, and a depletion 42 is thus formed below the portion 332. Furthermore, due to the depth of the trench, parasitic conduction in the layer 13 below this trench is substantially decreased.

In FIG. 6, the transistor 1 is illustrated in its on configuration. By applying a potential that is higher than the threshold voltage to the gate electrode 31, an inversion channel is formed in the semiconductor element 33. The semiconductor element 33 then becomes conductive. A conduction pathway is thus created between the portion 331 and the portion 332 through the semiconductor element 33, above the protrusion 341. An electrical connection is thus formed between the electron gas layer 17 of the domains 51 and 52. Conduction thus takes place between the drain 21 and the source 22. A contrario, conduction in the layer 13 below the trench is prevented, in particular due to the depth of the trench and due to the distance between the semiconductor element 33 and the bottom of the trench, the electromagnetic field applied by the gate electrode 31 to the layer 13 below the trench being severely diminished.

Figure 7:
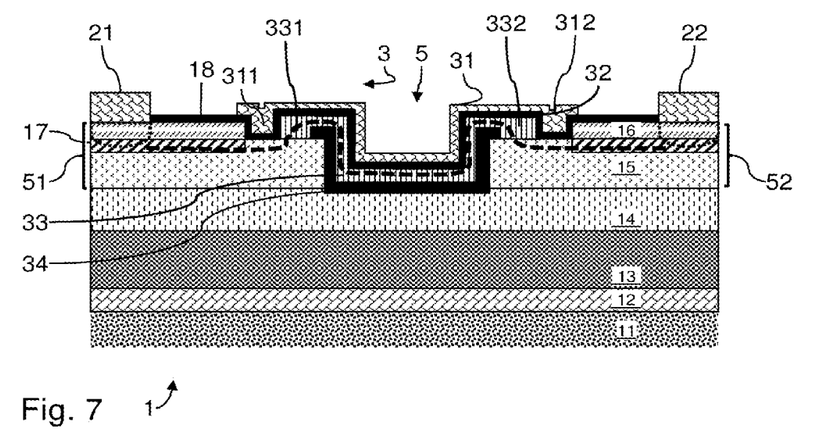
FIG. 7 is a view in cross section of a normally-off high-electron-mobility transistor according to one example of a fourth embodiment of the invention, in off configuration.

FIG. 7 is a view in cross section of a normally-off high-electron-mobility transistor 1 according to one example of a second embodiment of the invention.

In this fourth embodiment, the transistor 1 includes the following elements, which are identical to those of the first embodiment:
the substrate 11;
the matching layer;
the layer of semiconductor material 12;
the layer of semiconductor material 13;
the layer of semiconductor material 14;
the layer of semiconductor material 15.

The transistor 1 additionally includes a layer 16 made of a III-V alloy semiconductor material (for example identical to that of the first embodiment). The thickness of the layer 16 may be as described for the first embodiment. The semiconductor layers 15 and 16 are superposed in a manner known per se in order to form an electron gas layer 17 at the interface or in proximity to the interface between these layers 15 and 16.

The transistor 1 additionally includes a drain 21 formed in contact with the layer 16 and electrically connected to the electron gas layer 17. The transistor 1 additionally includes a source 22 formed in contact with the layer 16 and electrically connected to the electron gas layer 17.

The transistor 1 additionally includes a control gate 3, the drain 21 and the source 22 being positioned on either side of the control gate 3. A trench 5 is formed below the control gate 3 and passes through the layers 15 and 16, thus interrupting the electron gas layer 17. The trench 5 thus separates the superposition of the layers 15 and 16 and the electron gas layer 17 into two disjunct domains 51 and 52. The trench 5 extends here up to within the p-doped layer 14. The trench 5 may even extend beyond the layer 14.

The transistor 1 includes an insulating material element 34, electrically insulating the domains 51 and 52 of the superposition of the layers 15 and 16. The element 34 covers the lateral walls of the trench 5 and therefore makes contact with the lateral faces of the layer 15. The element 34 covers here the bottom wall of the trench 5 and therefore makes contact with the layer 14 at the bottom of the trench 5. The element 34 also includes edges that cover part of the layer 15 in the domains 51 and 52, respectively.

The transistor 1 additionally comprises a p-doped semiconductor element 33 that makes contact with the layer 15 in the domain 51 on the one hand and in the domain 52 on the other hand. The semiconductor element 33 thus includes a portion 331 in contact with the layer 15 in the domain 51 and a portion 332 in contact with the layer 15 in the domain 52. Furthermore, the semiconductor element 33 extends continuously between the portions 331 and 332, i.e. between the domains 51 and 52. The semiconductor element 33 is here formed so as to cover the insulating element 34. The semiconductor element 33 protrudes laterally beyond the insulating element 34, in order to form the portions 331 and 332 in contact with the layer 15. The semiconductor element 33 includes a part housed in the trench 5, which covers the lateral walls and the bottom wall of the insulating element 34.

Part of the layer 15 is not covered by the layer 16, both in the domain 51 and in the domain 52. Each of these parts makes it possible:
to form one of the edges of the element 34 covering part of the layer 15;
to form a contact between the portions 331 or 332 of the semiconductor element 33 and the layer 15;
to form a contact with a gate insulator 32.

The transistor 1 additionally comprises a gate insulator 32 formed on the semiconductor element 33 and overrunning until making contact with the layer 15 and against the lateral end faces of the semiconductor element 33. The transistor 1 additionally includes a gate electrode 31 formed on the gate insulator 32. The gate electrode 31 is formed at the vertical of the semiconductor element 33. In particular, the projection of the gate electrode 31 towards the substrate 11 in a direction normal to this substrate 11 includes the projection of the semiconductor element 33 towards this substrate 11 in the direction normal to this substrate 11. Furthermore, the gate electrode 31 includes overruns 311 and 312 covering the gate insulator 32 which makes contact with the layer 15. These overruns 311 and 312 thus extend in depth between the layer 16 and the portions 331 and 332, respectively. These overruns 311 and 312 thus allow an electromagnetic field to be applied laterally to the overruns 311 and 312.

Thus, the semiconductor element 33 is indeed positioned within the electromagnetic field of the gate electrode 31 when the latter is biased. The control electrode 31 may be produced in the same material as for the first embodiment. The gate electrode 31 is electrically insulated from the drain 21 and from the source 22 by a insulating layer 18, formed on the layers 15 and 16 in continuity of the gate insulator 32. A control potential is applied selectively to the gate electrode 31 via a control circuit (not illustrated).

In FIG. 7, the transistor 1 is illustrated in its off configuration. The insulating element 34 and the semiconductor element 33 render the transistor 1 normally off, conduction between the domains 51 and 52 being interrupted when a potential applied to the gate electrode 31 is lower than the threshold voltage.

By applying a potential that is higher than the threshold voltage to the gate electrode 31, the following are formed:
an accumulation of electrons below the gate insulator 32 in contact with the layer 15. A conduction pathway is thus created between the electron gas layer 17 and the semiconductor element 33;

an inversion channel in the semiconductor element 33. The semiconductor element 33 then becomes conductive. A conduction pathway is thus created between the portion 331 and the portion 332 through the semiconductor element 33. An electrical connection is thus formed between the electron gas layer 17 of the domains 51 and 52. Conduction thus takes place between the drain 21 and the source 22 (as illustrated by the dashed line).

Figure 8:
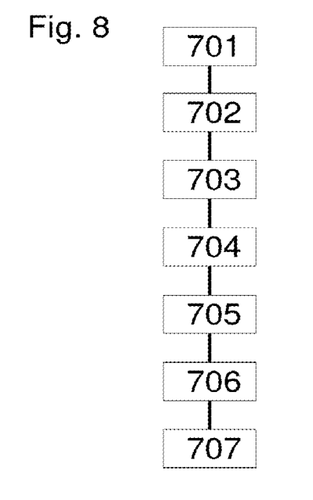
FIG. 8 is a diagram illustrating various steps implemented in the fabrication of a transistor according to the invention.

FIG. 8 is a flowchart illustrating various steps of an example of a process for fabricating a transistor according to the invention.

In a step 701, a superposition of a first layer of III-V alloy semiconductor material and a second layer of III-V alloy semiconductor material are provided beforehand, forming an electron gas layer at the interface or in proximity to the interface between these first and second layers. This superposition of the first and second layers is for example formed in a manner known per se, for example by epitaxy. The first and second layers are for example formed on a stack of layers 11 to 14 as described with reference to the first to fourth embodiments. In the case of a process for fabricating an electron-gas transistor, the first layer is a layer that is not intentionally doped.

In a step 702, a trench is formed that separates the superposition of the first and second layers into disjunct first and second domains. The electron gas is interrupted by this trench, which passes through the first and second layers. The trench may be formed in a manner known per se by photolithography and etching.

In a step 703, an electrically insulating layer is formed in order to cover the lateral walls and the bottom of the trench. The insulating layer may be positioned on the wafer scale then shaped by photolithography and etching so as to form an insulating element and to expose the upper surface of the second semiconductor layer, while retaining the insulator in the trench in order to insulate the first and second domains.

In a step 704, a semiconductor layer is formed so as to cover the insulating element. The semiconductor layer is subsequently shaped by photolithography and etching, so as to form a semiconductor element including portions in contact with the first and second domains of the superposition. Furthermore, the semiconductor element formed extends continuously over the insulating element between these in-contact portions. This semiconductor layer is preferably deposited in such a way as to be (p-)doped from the moment of its deposition. The semiconductor layer is for example deposited by means of a reactive sputtering step.

In a step 705, a gate insulator layer is formed so as to cover the semiconductor element.

In a step 706, a gate electrode is formed on the gate insulator, in line with the semiconductor element. The formation of the gate electrode may include the deposition of a polysilicon layer on the gate insulator layer, followed by a layer of a second insulator and of a gate metal, and lastly the shaping of the deposited layer by photolithography.

In a step 707, the gate electrode is connected to a control circuit that is configured to selectively apply a potential that is either lower or higher than the threshold voltage.

Since the steps of forming the drain and the source of the transistor are known per se by those skilled in the art, they will not be described in the description of a process for fabricating a transistor according to the invention.

The invention claimed is:

1. A normally-off high-electron-mobility field-effect transistor, comprising:

a superposition of a first layer of III-V alloy semiconductor material and a second layer of III-V alloy semiconductor material so as form an electron gas layer at the interface or in proximity to the interface between these first and second layers;

a trench separating the superposition of the first and second layers of semiconductor material into first and second domains, the trench extending completely through each of the first and second layers to form the first and second domains;

an insulating element positioned in said trench so as to electrically insulate said first and second domains from each other;

a p-doped semiconductor element in direct contact with the first or the second layer of semiconductor material of the first and second domains, and extending continuously between the first and second domains over said insulating element;

a gate insulator positioned on the semiconductor element; and a gate electrode positioned on the gate insulator.

2. The field-effect transistor according to claim 1, in which the p-doped semiconductor element is made of p-doped NiO.

3. The field-effect transistor according to claim 1, in which the p-doped semiconductor element is made of p-doped polysilicon.

4. The field-effect transistor according to claim 1, in which the p-doped semiconductor element is made of p-doped GaN.

5. The field-effect transistor according to claim 1, in which said p-doped semiconductor element extends into said trench.

6. The field-effect transistor according to claim 1, in which said insulating element includes a protrusion extending vertically beyond the trench, and in which said semiconductor element covers said protrusion.

7. The field-effect transistor according to claim 6, additionally comprising a third layer of p-doped semiconductor material on which said first layer is formed, said trench extending up to within said third layer of semiconductor material, in which the depth of said trench is at least equal to 100 nm and in which the thickness of said first layer of semiconductor material is at least equal to 70 nm.

8. The field-effect transistor according to claim 1, additionally comprising a third layer of p-doped semiconductor material on which said first layer is formed, said trench extending up to within said third layer of semiconductor material.

9. The field-effect transistor according to claim 8, in which the semiconductor element, the insulating element and the gate insulator are thin enough for the application of a threshold voltage to the gate electrode to form a conduction channel by inversion in the third layer of semiconductor material below said trench.

10. The field-effect transistor according to claim 1, in which the first layer of semiconductor material is made of GaN.

11. The field-effect transistor according to claim 1, in which the second layer of semiconductor material is made of AlGaN.

12. The field-effect transistor according to claim 1, comprising a first conduction electrode that is electrically connected to the electron gas of the first domain, and comprising a second conduction electrode that is electrically connected to the electron gas of the second domain.

13. The field-effect transistor according to claim 1, in which the thickness of said gate insulator is at most equal to 15 nm and/or in which said semiconductor element includes a p-type dopant concentration that is at least equal to $2*10^{17}$ cm$^{-3}$.

14. A system, comprising:

the field-effect transistor according to claim 1; and a control circuit configured to selectively apply a control voltage to said gate electrode, the amplitude of said control voltage forming a conductive inversion channel in said semiconductor element.

15. A process for fabricating a heterojunction field-effect transistor, comprising the steps of:

providing a superposition of a first layer of III-V alloy semiconductor material and a second layer of III-V alloy semiconductor material forming an electron gas layer or a hole gas layer at the interface or in proximity to the interface between these first and second layers;

forming a trench separating the superposition of the first and second layers of semiconductor material into first and second domains, the trench extending completely through each of the first and second layers to form the first and second domains;

forming an insulating element positioned in said trench so as to electrically insulate said first and second domains of the superposition;

forming a semiconductor element in direct contact with the second layer of semiconductor material of the first and second domains and extending continuously between the first and second domains over the insulating element, the semiconductor element being a p-doped semiconductor element;

forming a gate insulator on the semiconductor element; and forming a gate electrode on the gate insulator at the vertical of the semiconductor element.

\* \* \* \* \*